(12) United States Patent
Agostini et al.

(10) Patent No.: US 11,414,778 B2
(45) Date of Patent: Aug. 16, 2022

(54) PRODUCTION AND USE OF DYNAMIC STATE CHARTS WHEN GROWING A SINGLE CRYSTAL SILICON INGOT

(71) Applicant: GlobalWafers Co., Ltd., Hsinchu (TW)

(72) Inventors: Giorgio Agostini, San Giacomo di Laives (IT); Stephan Haringer, Ciardes (IT); Marco Zardoni, Merano (IT)

(73) Assignee: GlobalWafers Co., Ltd., Hsinchu (TW)

( * ) Notice: Subject to any disclaimer, the term of this patent is extended or adjusted under 35 U.S.C. 154(b) by 244 days.

(21) Appl. No.: 16/884,589

(22) Filed: May 27, 2020

(65) Prior Publication Data

US 2021/0032769 A1 Feb. 4, 2021

Related U.S. Application Data

(60) Provisional application No. 62/879,829, filed on Jul. 29, 2019.

(51) Int. Cl.
| | |
|---|---|
| *C30B 15/20* | (2006.01) |
| *C30B 15/10* | (2006.01) |
| *C30B 15/30* | (2006.01) |
| *C30B 29/06* | (2006.01) |

(52) U.S. Cl.
CPC .............. *C30B 15/20* (2013.01); *C30B 15/10* (2013.01); *C30B 15/30* (2013.01); *C30B 29/06* (2013.01)

(58) Field of Classification Search
CPC ....... C30B 15/002; C30B 15/10; C30B 15/20; C30B 15/30; C30B 29/06
See application file for complete search history.

(56) References Cited

U.S. PATENT DOCUMENTS

| | | | |
|---|---|---|---|
| 3,621,213 A | 11/1971 | Jen et al. | |
| 4,565,598 A | 1/1986 | Seymour | |
| 5,089,238 A * | 2/1992 | Araki | ..................... C30B 29/06 117/34 |
| 5,408,952 A * | 4/1995 | Wakabayashi | .......... C30B 15/14 117/201 |
| 2014/0144372 A1* | 5/2014 | Swaminathan | ......... C30B 15/12 117/213 |

* cited by examiner

*Primary Examiner* — Matthew J Song
(74) *Attorney, Agent, or Firm* — Armstrong Teasdale LLP

(57) ABSTRACT

Methods for growing a single crystal silicon ingot are disclosed. A dynamic state chart that monitors a plurality of ingot growth parameters may be produced and used during production of single crystal silicon ingots. In some embodiments, the dynamic state chart is a dynamic circle map chart having a plurality of sectors with each sector monitoring an ingot growth parameter.

20 Claims, 7 Drawing Sheets

PRODUCTION AND USE OF DYNAMIC STATE CHARTS WHEN GROWING A SINGLE CRYSTAL SILICON INGOT

CROSS-REFERENCE TO RELATED APPLICATION

This application claims the benefit of U.S. Provisional Patent Application No. 62/879,829, filed Jul. 29, 2019, which is incorporated herein by reference in its entirety.

FIELD OF THE DISCLOSURE

The field of the disclosure relates to methods for growing a single crystal silicon ingot and, in particular, production and use of dynamic state charts that monitor a plurality of ingot growth parameters.

BACKGROUND

Single crystal silicon ingots may be grown in a Czochralski process in which an ingot is withdrawn from a silicon melt within an ingot puller system. Single crystal ingot growth involves a number of growth parameters that are monitored to ensure successful growth (e.g., to achieve a target ingot diameter without dislocations forming in the ingot). This is particularly the case for continuous Czochralski processes in which ingots are continuously grown by adding silicon to the melt during ingot growth. Continuous Czochralski is particularly sensitive to changes in the various ingot growth parameters and is difficult to control. Small changes in one parameter may cascade to other parameters which may cause the system to lose its equilibrium state.

A need exists for systems and methods that allow for monitoring and/or control of various ingot growth parameters and/or that provide a visual output of the parameters that is easily accessible by the operator and provides a simple visual overview of the ingot growth system.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for growing a single crystal silicon ingot in a Czochralski process. A melt of silicon is prepared in a crucible. A single crystal silicon ingot is withdrawn from the melt. A plurality of growth parameters related to growth of the single crystal silicon ingot are provided. A dynamic state chart that includes a visual representation of the growth parameters is provided.

Another aspect of the present disclosure is directed to an ingot growth system for producing a single crystal silicon ingot. The system includes a growth chamber and a crucible disposed within the growth chamber. The crucible is configured to hold a melt including molten silicon. The system includes an ingot pulling mechanism for withdrawing an ingot from the melt. The system includes a control unit comprising a processor and a memory. The memory stores instruction that, when executed by the processor, cause the processor to determine a plurality of growth parameters related to growth of the single crystal silicon ingot and to provide a dynamic state chart that includes a visual representation of the growth parameters to a user.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods and systems for growing a single crystal silicon ingot. In example methods, a dynamic state chart is provided that includes a visual representation of a plurality of growth parameters. The dynamic state chart may be described herein as being used in a continuous Czochralski process in which polysilicon is continuously or intermittently added to a crucible. The dynamic state chart may also be used in a batch Czochralski system.

Figure 1:
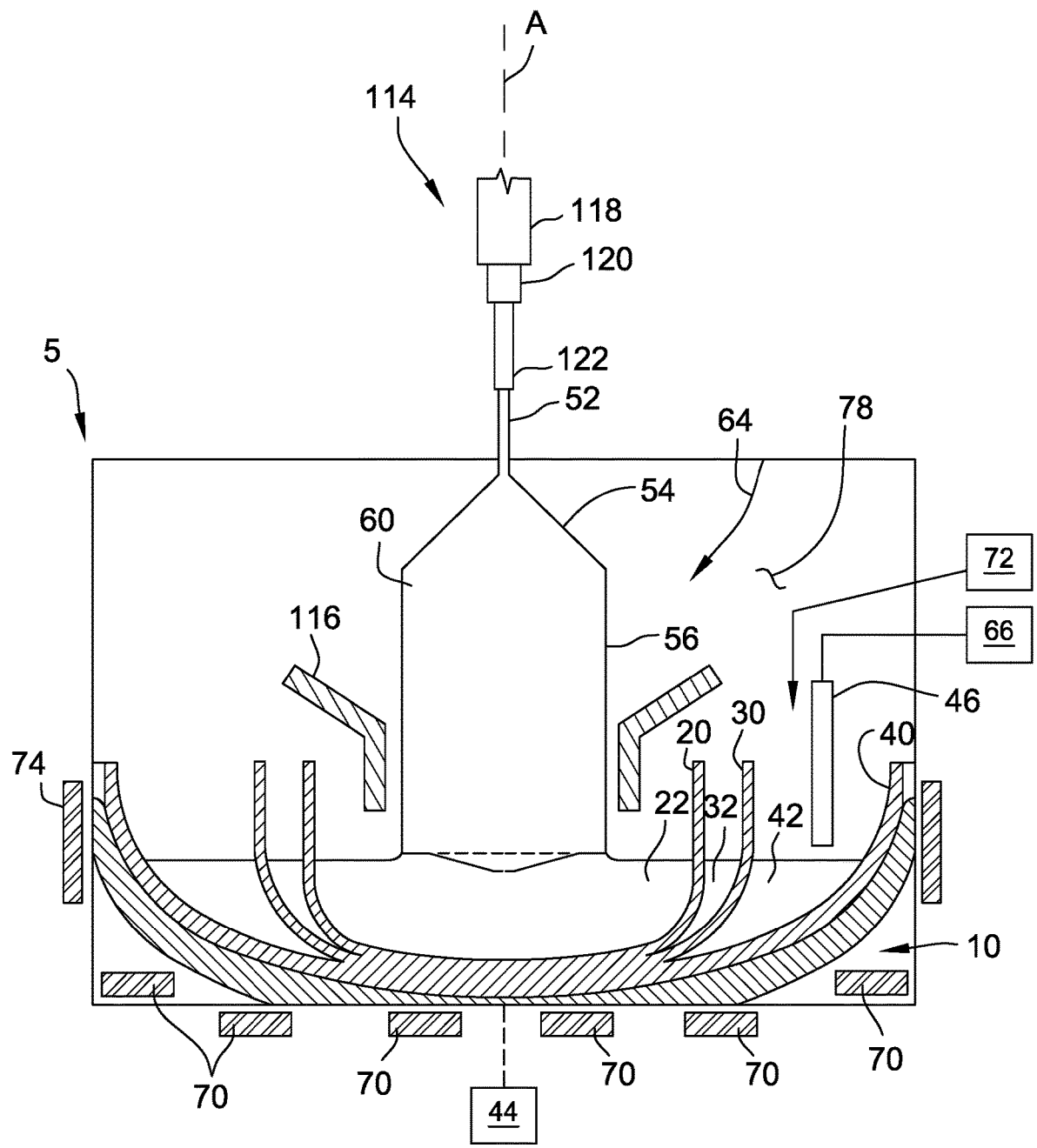
FIG. 1 is a cross-section of an example ingot growth system.

An example ingot growth system 5 for producing an ingot 60 by a continuous Czochralski process is shown in FIG. 1. The ingot growth system 5 includes a crucible assembly 10 having a plurality of weirs 20, 30, 40 or fluid barriers that separate the melt into different melt zones. In the illustrated embodiment, the crucible assembly 10 includes a first weir 20 (broadly, a fluid barrier) defining an inner melt zone 22 of the silicon melt. The inner melt zone 22 is the growth region from which the single crystal silicon ingot 60 is grown. A second weir 30 defines a middle melt zone 32 of the silicon melt. A third weir 40 defines an outer melt zone 42 of the silicon melt.

A feeding tube 46 feeds polycrystalline silicon, which may be granular, chunk, or a combination of granular and chunk, into the outer melt zone 42 at a rate sufficient to maintain a substantially constant melt elevation level and volume during growth of the ingot 60. The first weir 20, second weir 30, and third weir 40 each have a generally annular shape, and have at least one opening defined therein to permit molten silicon to flow radially inward towards the growth region of the inner melt zone 22.

The crucible configuration depicted in FIG. 1 is exemplary and suitable for carrying out the process of the present disclosure. Other configurations suitable for continuous Czochralski may be used without departing from the scope of the present disclosure. For example, the crucible assembly 10 may lack the second weir 30 and/or may lack the third weir 40.

Generally, the melt from which the ingot 60 is drawn is formed by loading polycrystalline silicon into a crucible to form an initial silicon charge. In general, an initial charge is between about 100 kilograms and about 200 kilograms of polycrystalline silicon, which may be granular, chunk, or a combination of granular and chunk. The mass of the initial charges depends on the desired crystal diameter and hot zone design. Initial charge does not reflect the length of crystal, because polycrystalline silicon is continuously fed during crystal growth. For example, if polycrystalline silicon is fed continuously and the chamber has a sufficient height, crystal length can be extended to 2000 mm, 3000 mm, or even 4000 mm in length.

A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge, and thereby form a silicon melt comprising molten silicon. The silicon melt has an initial volume of molten silicon and has an initial melt elevation level, and these parameters are determined by the size of the initial charge. In some embodiments, the crucible comprising the silicon melt is heated to a temperature of at least about 1425° C., at least about 1450° C. or even at least about 1500° C.

A pulling mechanism 114 is provided within the system 5 for growing and pulling the ingot 60 from the melt within the inner melt zone 22. The pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt in the inner melt zone 22. The pulling mechanism 114 is operated to cause the seed crystal 122 to rise along pull axis A. This causes a single crystal ingot 60 to be pulled from the melt.

Once the charge is liquefied to form a silicon melt comprising molten silicon, the silicon seed crystal 122 is lowered to contact the melt within the inner melt zone 22. The silicon seed crystal 122 is then withdrawn from the melt with silicon being attached thereto to form a neck 52 thereby forming a melt-solid interface near or at the surface of the melt. Generally, the initial pull speed to form the neck 52 is high. In some embodiments, the silicon seed crystal 122 and neck 52 are withdrawn at a neck portion pull rate of at least about 1.0 mm/minute, such as between about 1.5 mm/minute and about 6 mm/minute, such as between about 3 mm/minute and about 5 mm/minute. The neck 52 may have a length between about 300 mm and about 700 mm, such as between about 450 mm and about 550 mm. However, the length of the neck 52 may vary outside these ranges.

The pulling mechanism 114 may rotate the seed crystal 122 and ingot 60 connected thereto. A crucible drive unit 44 may rotate the crucible assembly 10. In some embodiments, the silicon seed crystal 122 and the crucible assembly 10 are rotated in opposite directions, i.e., counter-rotation. Counter-rotation achieves convection in the silicon melt. Rotation of crystal 122 is mainly used to provide a symmetric temperature profile, suppress angular variation of impurities and also to control crystal melt interface shape. In some embodiments, the silicon seed crystal 122 is rotated at a rate of between about 5 rpm and about 30 rpm, or between about 5 rpm and about 20 rpm, or between about 8 rpm and about 20 rpm, or between about 10 rpm and about 20 rpm. In some embodiments, the crucible assembly 10 is rotated at a rate between about 0.5 rpm and about 10 rpm, or between about 1 rpm and about 10 rpm, or between about 4 rpm and about 10 rpm, or between about 5 rpm and about 10 rpm. In some embodiments, the seed crystal 122 is rotated at a faster rate than the crucible assembly 10. In some embodiments, the seed crystal 122 is rotated at a rate that is at least 1 rpm higher than the rotation rate of the crucible assembly 10, such as at least about 3 rpm higher, or at least about 5 rpm higher.

After formation of the neck 52, an outwardly flaring seed-cone portion 54 adjacent the neck 52 is grown. In general, the pull rate is decreased from the neck portion pull rate to a rate suitable for growing the outwardly flaring seed-cone portion 54. For example, the seed-cone pull rate during growth of the outwardly flaring seed-cone may be between about 0.5 mm/min and about 2.0 mm/min, such as about 1.0 mm/min. In some embodiments, the outwardly flaring seed-cone 54 has a length between about 100 mm and about 400 mm, such as between about 150 mm and about 250 mm. The length of the outwardly flaring seed-cone 54 may vary outside these ranges. In some embodiments, the outwardly flaring seed-cone 54 is grown to a terminal diameter of about 150 mm, at least about 150 mm, about 200 mm, at least about 200 mm, about 300 mm, at least about 300 mm, about 450 mm, or even at least about 450 mm. The terminal diameter of the outwardly flaring seed-cone 54 is generally equivalent to the diameter of the constant diameter of the main body 56 of the single crystal silicon ingot 60.

After formation of the neck 52 and the outwardly flaring seed-cone 54 adjacent the neck 52, the constant diameter portion 56 or "main body" is then grown. The diameter of the main body 56 may vary and, in some embodiments, the diameter may be about 150 mm, at least about 150 mm, about 200 mm, at least about 200 mm, about 300 mm, at least about 300 mm, about 450 mm, or even at least about 450 mm. The main body 56 of the single crystal silicon ingot 60 is eventually grown to be at least about 1000 mm long, such as at least 1400 mm long, such as at least 1500 mm long, or at least 2000 mm long, or at least 2200 mm, such as 2200 mm, or at least about 3000 mm long, or at least about 4000 mm long.

While the ingot 60 is pulled from the melt, silicon is added to the outer melt zone 42 through the tube 46 or other channel to replenish the melt in the ingot growth system 5. Solid polycrystalline silicon may be added from a polycrystalline silicon feed system 66 and may be continuously or intermittently added to the ingot growth system 5 to maintain the melt level. Generally, polycrystalline silicon may be metered into the ingot growth system 5 by any method available to those of skill in the art.

In some embodiments, dopant is also added to the melt during ingot growth. Dopant may be introduced from a dopant feed system 72. Dopant may be added as a gas or solid and may be added to the outer melt zone 42.

The system 5 may include a heat shield 116 disposed about the ingot 60 to permit the growing ingot 60 to radiate its latent heat of solidification and thermal flux from the melt. The heat shield 116 may be at least partially conical in shape and angles downwardly at an angle to create an annular opening in which the ingot 60 is disposed. A flow of an inert gas 64, such as argon, is typically provided along the length of the growing crystal. The ingot 60 is pulled through a growth chamber 78 that is sealed from the surrounding atmosphere.

A plurality of independently controlled annular bottom heaters 70 may be disposed in a radial pattern beneath the crucible assembly 10. Annular bottom heaters 70 apply heat in a relatively controlled distribution across the entire base surface area of the crucible assembly 10. The annular base heaters 70 may be planar resistive heating elements that are individually controlled as described in U.S. Pat. No. 7,635,414, which is incorporated herein by reference for all relevant and consistent purposes. The system 5 may include one or more side heaters 74 disposed radially outward to the crucible assembly 10 to control the temperature distribution through melt.

The ingot growth system 5 shown in FIG. 1 and described herein is exemplary and generally any system in which a crystal ingot is prepared by a continuous Czochralski method may be used unless stated otherwise.

Figure 2:
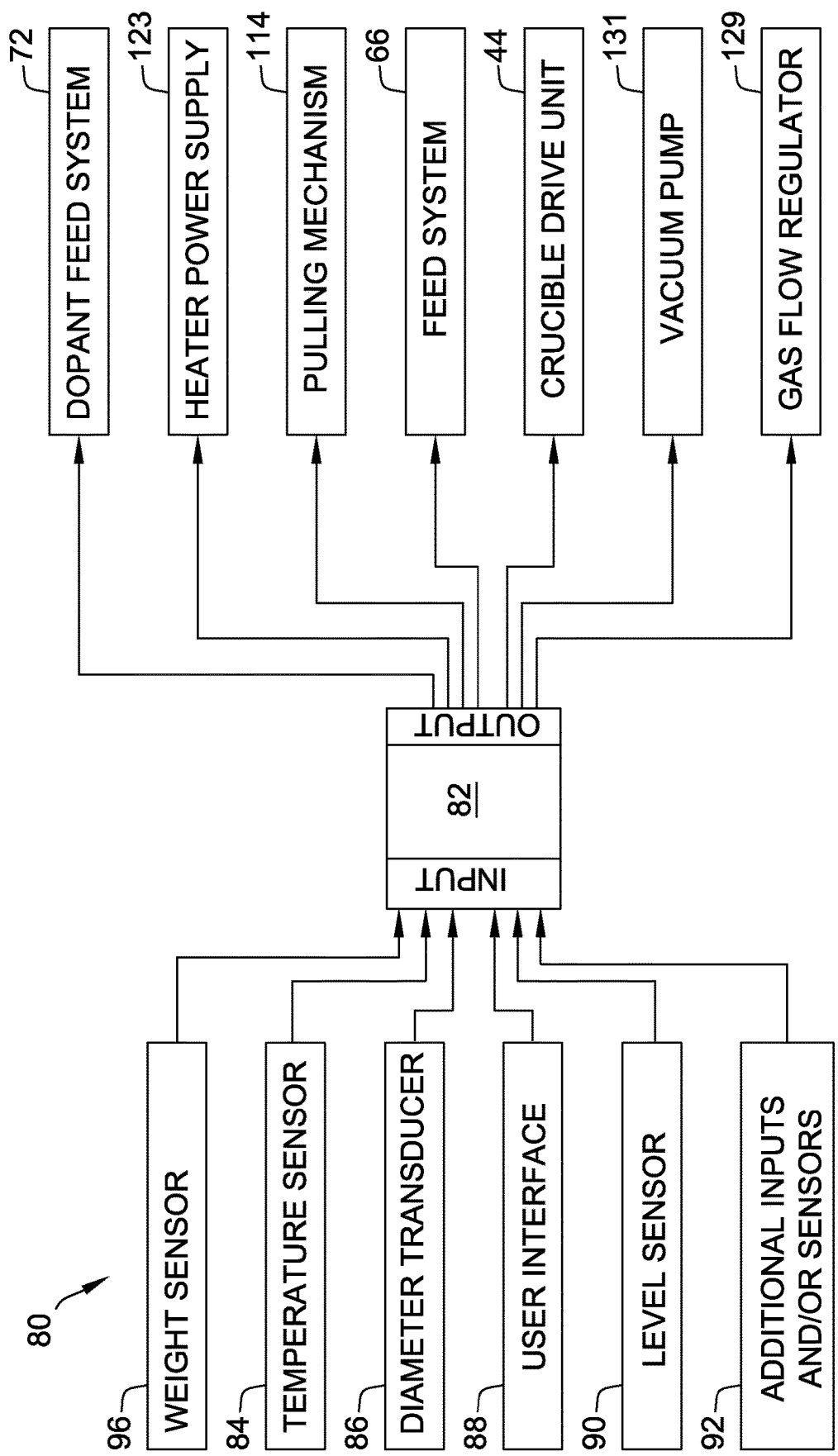
FIG. 2 is a schematic of a control system for controlling and/or monitoring ingot growth.

The system 5 for producing a silicon ingot 60 may include a control system 80 (FIG. 2) for controlling and/or monitoring ingot growth. The system 80 may include a control unit 82 that controls the ingot growth system 5 based on user inputs and sensors that detect one or more parameters related to crystal growth. For example, a temperature sensor 84 such as a photocell (or pyrometer) measures the temperature of melt at its surface. A diameter transducer 86 measures a diameter of the ingot 60. A level sensor measures the level of the melt in the ingot growth system 5. A weight sensor 96 may be used to measure the crucible weight or ingot weight. The control unit 82 may also be communicatively connected to a user interface 88 at which an operator may input one or more commands (e.g., set points) for control of ingot growth. The system 5 may include other inputs and/or sensors 92 including system power, current, vacuum, length, travel, position, speed, distance, rotation, flow, pressure, volume and/or weight.

The control unit 82 is used to regulate the plurality of process parameters including, but not limited to, at least one of crystal rotation rate, crucible rotation rate, ingot diameter, and melt temperature. The control unit 82 may control a heater power supply 123 to control the heat output of the bottom heaters 70 (which may also be controlled independently) and/or side heaters 74. The control unit 82 is communicatively connected to the pulling mechanism 114 to control the pull rate and/or rotation rate of the ingot 60 and connected to the crucible drive unit 44 to regulate the rotation rate of the crucible assembly 10. The control unit 82 also may control the polycrystalline silicon feed system 66 to regulate the rate at which polycrystalline silicon is added to the melt. The control unit 82 may also be connected to a dopant feed system 72 to regulate addition of dopant into the melt. The control unit 82 may also control one or more pumps and valves to control the growth chamber pressure and/or filter cleaning. The control unit 82 may control the system 5 by use of one or more algorithms (e.g., algorithms stored and/or executed by the control unit 82). While one control unit 82 is shown, the system 80 may include two or more control units 82 for control of one or more ingot growth parameters.

In various embodiments, the control unit 82 may include a processor that processes the signals received from various sensors of the system 5 including, but not limited to, temperature sensor 84, diameter transducer 86, and level sensor 90, as well as to control one or more devices of system 5 including, but not limited to: crucible drive unit 44, pulling mechanism 114, heater power supply 123, vacuum pump 131, gas flow regulator 129, polycrystalline feed system 66, dopant feed system 72 and any combination thereof.

Control unit 82 may be a computer system. Computer systems, as described herein, refer to any known computing device and computer system. As described herein, all such computer systems include a processor and a memory. However, any processor in a computer system referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

The term processor, as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor."

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

In one embodiment, a computer program is provided to enable control unit 82, and this program is embodied on a computer readable medium. In an example embodiment, the computer system is executed on a single computer system, without requiring a connection to a server computer. In a further embodiment, the computer system is run in a Windows® environment (Windows is a registered trademark of Microsoft Corporation, Redmond, Wash.). In yet another embodiment, the computer system is run on a mainframe environment and a UNIX® server environment (UNIX is a registered trademark of X/Open Company Limited located in Reading, Berkshire, United Kingdom). Alternatively, the computer system is run in any suitable operating system environment. The computer program is flexible and designed to run in various different environments without compromising any major functionality. In some embodiments, the computer system includes multiple components distributed among a plurality of computing devices. One or more components may be in the form of computer-executable instructions embodied in a computer-readable medium.

The computer systems and processes are not limited to the specific embodiments described herein. In addition, components of each computer system and each process can be practiced independent and separate from other components and processes described herein. Each component and process also can be used in combination with other assembly packages and processes.

Figure 3:
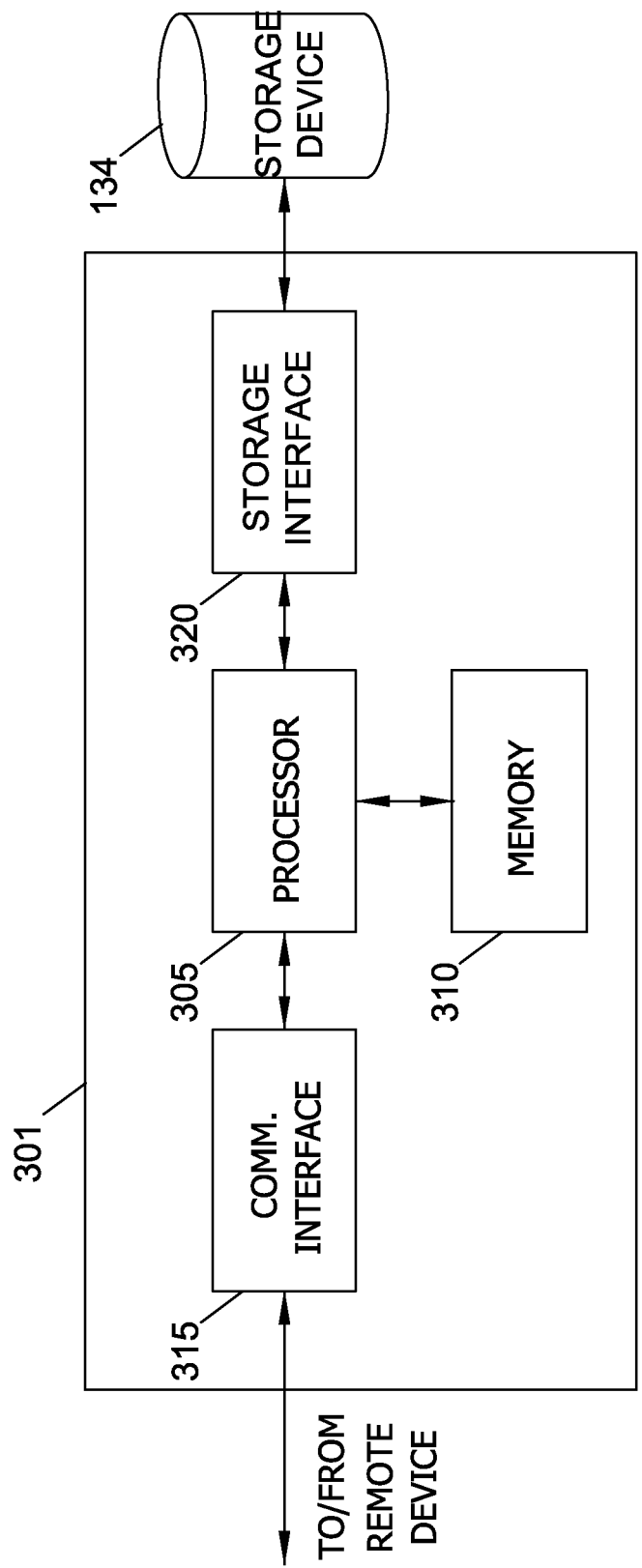
FIG. 3 is a schematic of a system for receiving measurements from one or more sensors of the ingot growth system.

In one embodiment, the computer system may be configured as a server system. FIG. 3 illustrates an example configuration of a server system 301 used to receive measurements from one or more sensors including, but not limited to: temperature sensor 84, diameter transducer 86, and level sensor 90, and any combination thereof, as well as to control one or more devices of system 5 including, but not limited to: crucible drive unit 44, pulling mechanism 114, heater power supply 123, feed system 66, vacuum pump 131, gas flow regulator 129, dopant feed system 72 and any combination thereof as described herein and illustrated in the embodiment of FIGS. 1-2. Referring again to FIG. 3, server system 301 may also include, but is not limited to, a database server. In this example embodiment, server system 301 performs all of the steps used to control one or more devices of system 80 as described herein.

Server system 301 includes a processor 305 for executing instructions. Instructions may be stored in a memory 310, for example. Processor 305 may include one or more processing units (e.g., in a multi-core configuration) for executing instructions. The instructions may be executed within a variety of different operating systems on the server system 301, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language (e.g., C, C#, C++, Java, or any other suitable programming languages).

Processor 305 is operatively coupled to a communication interface 315 such that server system 301 is capable of communicating with a remote device such as a user system or another server system 301. For example, communication interface 315 may receive requests (e.g., requests to provide an interactive user interface to receive sensor inputs and to control one or more devices of system 80) from a client system via the Internet.

Processor 305 may also be operatively coupled to a storage device 134. Storage device 134 is any computer-operated hardware suitable for storing and/or retrieving data. In some embodiments, storage device 134 is integrated in server system 301. For example, server system 301 may include one or more hard disk drives as storage device 134. In other embodiments, storage device 134 is external to server system 301 and may be accessed by a plurality of server systems 301. For example, storage device 134 may include multiple storage units such as hard disks or solid state disks in a redundant array of inexpensive disks (RAID) configuration. Storage device 134 may include a storage area network (SAN) and/or a network attached storage (NAS) system.

In some embodiments, processor 305 is operatively coupled to storage device 134 via a storage interface 320. Storage interface 320 is any component capable of providing the processor 305 with access to storage device 134. Storage interface 320 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 305 with access to storage device 134.

Memory 310 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are exemplary only, and are thus not limiting as to the types of memory usable for storage of a computer program.

Figure 4:
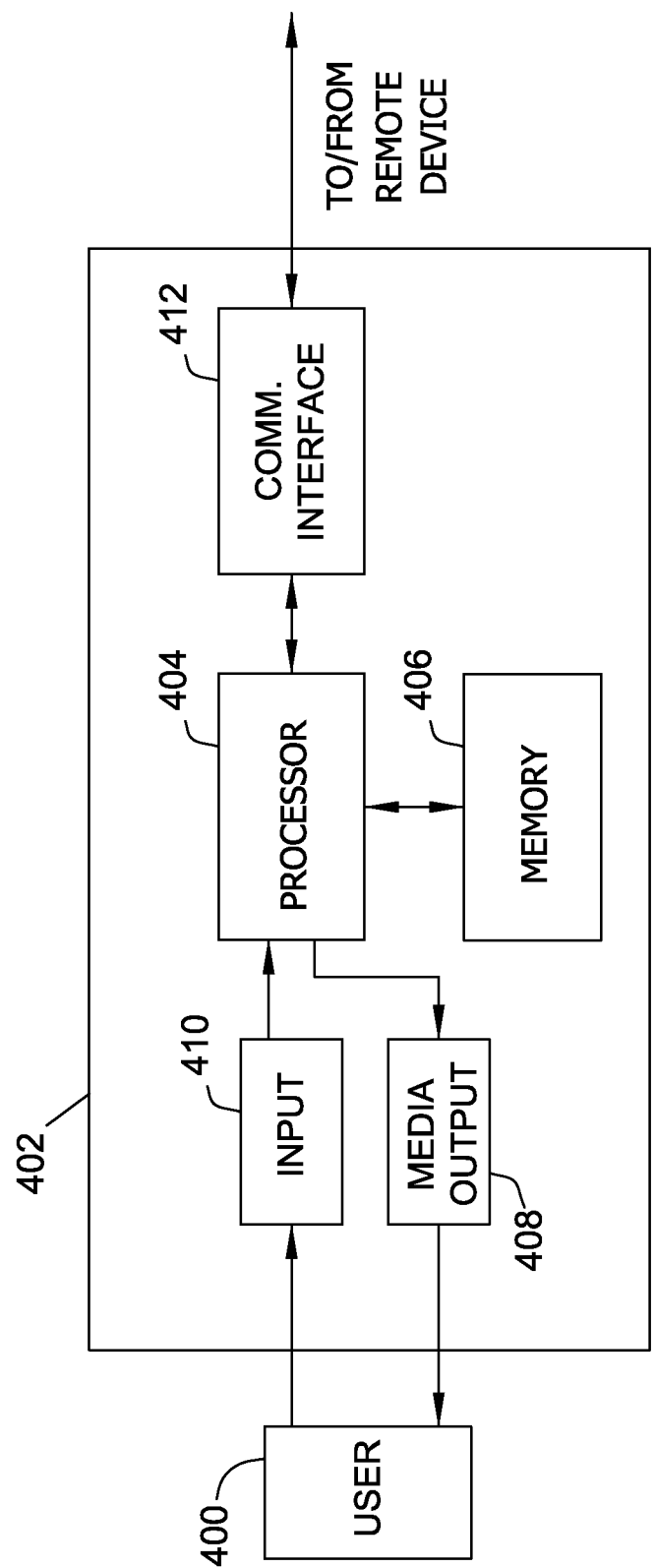
FIG. 4 is a schematic of a computing device for controlling the ingot growth system.

In another embodiment, the computer system may be provided in the form of a computing device, such as a computing device 402 (shown in FIG. 4). Computing device 402 includes a processor 404 for executing instructions. In some embodiments, executable instructions are stored in a memory 406. Processor 404 may include one or more processing units (e.g., in a multi-core configuration). Memory 406 is any device allowing information such as executable instructions and/or other data to be stored and retrieved. Memory 406 may include one or more computer-readable media.

In another embodiment, the memory included in the computing device of the control unit 143 may include a plurality of modules. Each module may include instructions configured to execute using at least one processor. The instructions contained in the plurality of modules may implement at least part of the method for simultaneously regulating a plurality of process parameters as described herein when executed by the one or more processors of the computing device. Non-limiting examples of modules stored in the memory of the computing device include: a first module to receive measurements from one or more sensors and a second module to control one or more devices of the system 80.

Computing device 402 also includes one media output component 408 for presenting information to a user 400. Media output component 408 is any component capable of conveying information to user 400. In some embodiments, media output component 408 includes an output adapter such as a video adapter and/or an audio adapter. An output adapter is operatively coupled to processor 404 and is further configured to be operatively coupled to an output device such as a display device (e.g., a liquid crystal display (LCD), organic light emitting diode (OLED) display, cathode ray tube (CRT), or "electronic ink" display) or an audio output device (e.g., a speaker or headphones).

In some embodiments, client computing device 402 includes an input device 410 for receiving input from user 400. Input device 410 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 408 and input device 410.

Computing device 402 may also include a communication interface 412, which is configured to communicatively couple to a remote device such as server system 301 or a web server.

Communication interface 412 may include, for example, a wired or wireless network adapter or a wireless data transceiver for use with a mobile phone network (e.g., Global System for Mobile communications (GSM), 3G, 4G, 5G or Bluetooth) or other mobile data network (e.g., Worldwide Interoperability for Microwave Access (WIMAX)).

Stored in memory 406 are, for example, computer-readable instructions for providing a user interface to user 400 via media output component 408 and, optionally, receiving and processing input from input device 410. A user interface may include, among other possibilities, a web browser and an application. Web browsers enable users 400 to display and interact with media and other information typically embedded on a web page or a website from a web server. An application allows users 400 to interact with a server application. The user interface, via one or both of a web browser and an application, facilitates display of information related to the process of producing a single crystal silicon ingot with low oxygen content.

Figure 5:
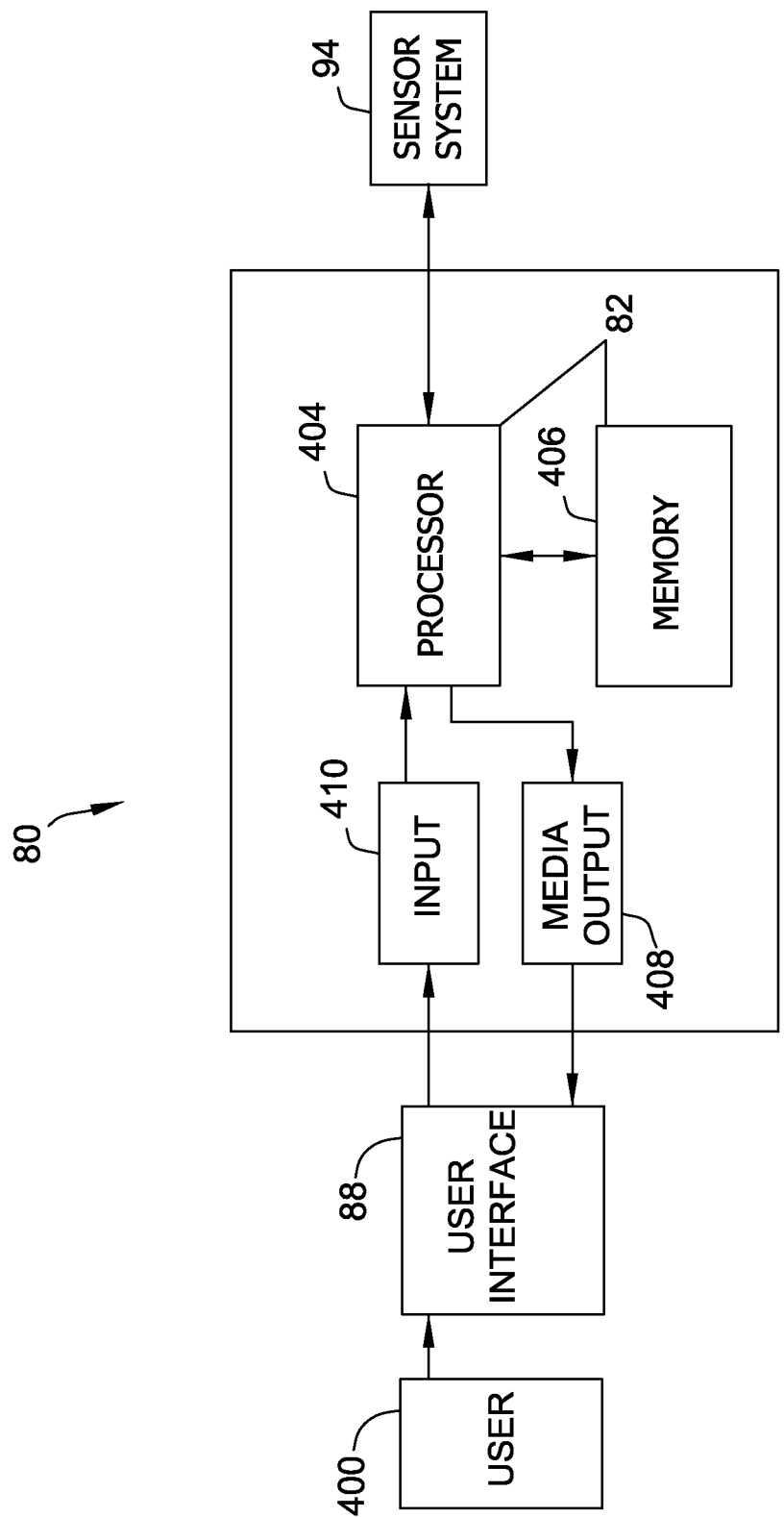
FIG. 5 is a schematic of a control system for controlling and/or monitoring ingot growth.

In some embodiments and as shown in FIG. 5, the control unit 82 includes a processor 404 and memory 406. The memory 406 stores instruction that, when executed by the processor 404, cause the processor 404 to determine a plurality of growth parameters related to growth of the single crystal silicon ingot 60. The processor 404 may also provide a dynamic state chart 504 (FIG. 6) that includes a visual representation of the growth parameters to a user as discussed below.

In some embodiments, the control system 80 (FIG. 2) is configured to provide a plurality of growth parameters related to growth of the single crystal silicon ingot 60 to a user. For example and as shown in FIG. 5, the control system 80 may take input from a sensor system 94 which may include one or more of the sensors shown in FIG. 2. Input device 410 may also be communicated to the control unit 82. The control unit 82 is communicatively connected to a user interface 88 such as through a media output 408 as shown in FIG. 5. The user interface 88 includes the plurality of growth parameters related to growth of the single crystal silicon ingot. The user interface 88 may include a visual media (e.g., screen showing information and/or capable of accepting information from a user). The user interface may include a program, application, and/or web browser or the like.

In some embodiments, the control system 80 for modifying, changing or controlling the ingot growth system 5 includes a control unit 82 that is different from the control unit used to produce a dynamic state chart 504 described below. In other embodiments, the control system 80 for modifying, changing or controlling the ingot growth system 5 is part of the same system which produces the user interface 88 that includes the dynamic state chart (i.e., the same control unit 82 is used). The user interface 88 may include a development environment such as Microsoft Visual Studio, Oracle Java, Siemens Wincc, Wonderware Intouch or the like. The development environment is used to create the features of the interface. A program (e.g., runtime application) runs on the machine (e.g., computer or server) to provide the user interface 88.

Figure 6:
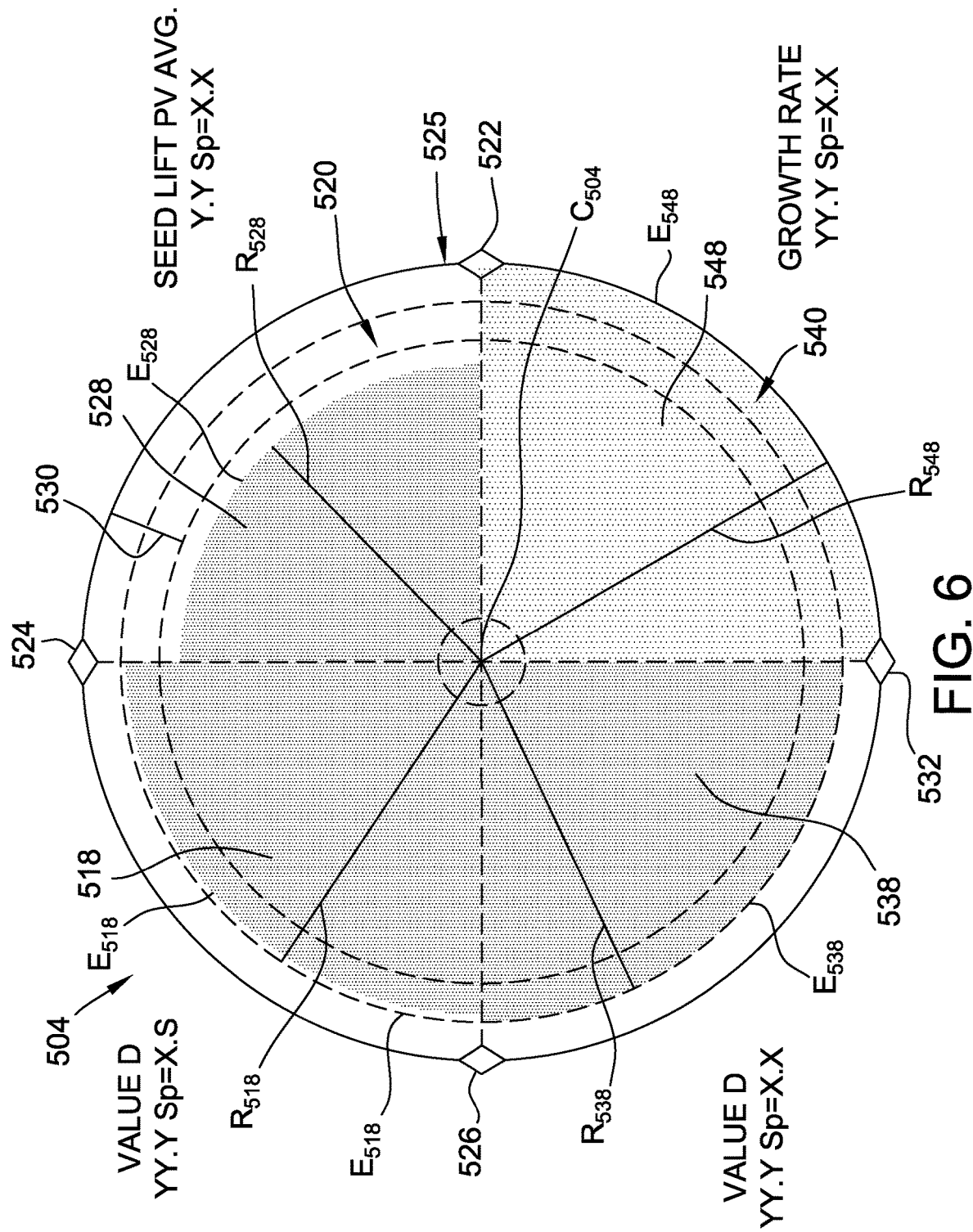
FIG. 6 is a dynamic state chart that includes four sectors with each sector associated with an ingot growth parameter.

In some embodiments, the user interface 88 includes or otherwise displays a dynamic state chart that is viewable by the user. For example, a dynamic state chart may provide a visual (e.g., graphical) representation of the plurality of growth parameters that change in response to changes in the growth parameters. An example dynamic state chart 504 is shown in FIG. 6. The example dynamic state chart 504 is a circle state chart that is divided into sectors 518, 528, 538, 548. Each sector is associated with a different growth parameter. While four sectors are shown in FIG. 6, the state chart 504 may include more or less sectors associated with an ingot growth parameter (e.g., 2 or more sectors, 3 or more, 4 or more, 5 or more, 6 or more, 8 or more, or 10 or more sectors). Suitable ingot growth parameters that may be associated with the sectors of the dynamic state chart 504 include, for example and without limitation, the ingot target length, the ingot diameter, the seed lift velocity, distance between the heat shield and the melt surface (i.e., heat shield position), polysilicon feed rate to the crucible (as in a continuous Czochralski system), dopant feed rate to the crucible, ingot puller pressure, ingot growth rate (e.g., radial growth rate in crown) or the like.

In some embodiments, the circle state chart may have one or more dynamic features. For example, one or more the sectors 518, 528, 538, 548 may change in size in response to changes in the value of the corresponding ingot growth parameter. Each sector 518, 528, 538, 548 may have a radius $R_{518}$, $R_{528}$, $R_{538}$, $R_{548}$ that extends from the circle state map center $C_{504}$ to the respective outer edge $E_{518}$, $E_{528}$, $E_{538}$, $E_{548}$ of the sector 518, 528, 538, 548. The radius $R_{518}$, $R_{528}$, $R_{538}$, $R_{548}$ changes in response to changes in the value of the growth parameter.

One or more of the sectors 518, 528, 538, 548 of the circle state chart 504 may include a minimum growth parameter visual 520 and/or maximum growth parameter visual 525. In the illustrated embodiment, the minimum growth parameter visual 520 is a first arc and the maximum growth parameter visual 525 is a second arc that is disposed radially outward from the first arc. The first and second arcs 520, 525 define an annular sector 530. The annular sector 530 may represents an acceptable range of the respective growth parameter.

In the illustrated embodiment, the dynamic state chart 504 also includes a target growth parameter visual 540. A target growth parameter visual 540 may be associated with each sector and represent the target value for the respective growth parameter. The target growth parameter visual 540 may be a third arc as shown in FIG. 6.

The ingot growth parameters may be normalized over the radius of the circle state chart 504. For example, the minimum, maximum and target growth parameter arcs of each sector 518, 528, 538, 548 may be at the same respective radial positions (i.e., the same distance from the circle state chart center $C_{504}$) such that the minimum arcs 520 form a circle, the target growth parameter arcs 540 form a circle and the maximum arcs 525 form a circle. In other embodiments, the arcs of the sectors 518, 528, 538, 548 are at different radial positions.

In some embodiments, each sector 518, 528, 538, 548 changes in color and/or darkness in response to changes of the value of the respective ingot growth parameter. For example, sectors which are below or at the target value (shown by target arc 540) may be a first color (represented by a first stippling pattern in first, second and third sectors 518, 528, 538) and sectors which are above the target value may be a second color (represented by a second stippling pattern in the fourth sector 548). In some embodiments, the color or intensity of color may change within the sector. For example, the color within a sector may become progressively darker from the center $C_{504}$ toward the outer edge $E_{518}$, $E_{528}$, $E_{538}$, $E_{548}$ (e.g., with the sector being most dark at the maximum target growth parameter visual 525).

The circle state chart 504 may include one or more lobes 522, 524, 526, 532 to monitor one or more ingot growth parameters. The lobes 522, 524, 526, 532 may change in distance from the circle chart center C504 based on changes in the ingot growth parameter. Alternatively, the lobes 522, 524, 526, 532 may change in color or size in response to changes in the ingot growth parameters.

The state chart 504 is an example state chart and other state charts that provide information to the user related to two or more ingot growth parameters may be used unless stated otherwise.

One or more of the growth parameters that are monitored in the state chart 504 may be measured directly in the ingot growth system 5 (FIG. 1). For example, the parameter may be measured by a sensor of the sensor system 94 (FIG. 5). Example sensors include the temperature sensor 84, diameter transducer 86, and level sensor 90, and weight sensor 96. Instead of being directly measured, one or more of the growth parameters may be generated by an algorithm such as an algorithm stored in the control unit 82.

Compared to conventional methods and systems for growing a single crystal silicon ingot in a continuous Czochralski process, the methods of embodiments of the present disclosure have several advantages. By providing a dynamic state chart, several ingot growth parameters may be quickly accessed by an operator which allows changes to the ingot growth system to be made quicker relative to systems in which the parameters are accessed in multiple locations (e.g., multiple pages). In embodiments in which the dynamic state chart is a dynamic circle map divided into sectors, each sector may be associated with an ingot growth parameter which allows the operator to gain a quick overview of the performance of the system. The ingot growth parameters may be normalized in the dynamic state chart which allows the parameters to have a common growth visual (e.g., minimum growth visual, maximum growth visual and/or target growth visual which may each be represented by an arc in the dynamic state chart). The dynamic state chart provides an operator with quick access to the system parameters without overwhelming the operator with information.

EXAMPLES

The processes of the present disclosure are further illustrated by the following Examples. These Examples should not be viewed in a limiting sense.

Example 1

Dynamic State Chart that Includes Four Ingot Growth Parameters

A dynamic state chart developed for control of ingot growth in a continuous Czochralski ingot growth system is shown in FIG. 6. The dynamic state chart is a dynamic circle chart having four sectors 518, 528, 538, 548 (shown as separated by dashed lines). The first sector 518 and third sector 538 monitor "Value D" which represents other ingot growth parameters (e.g., weight, temperature, diameter, level, system pressure or the like). The second sector 528 monitors the seed lift (i.e., the rate at which the seed crystal 122 is raised in the ingot puller). The fourth sector 548 monitors the growth rate of the ingot. As shown in the dynamic state chart of FIG. 6, "Value D" is at or near the target growth value indicated by the middle arc 540. Seed lift is below the target value and the growth rate is above the target value. The dynamic state chart allows a plurality of growth parameters to be monitored and controlled in a single visual.

Example 2

Dynamic State Chart that Includes Seven Ingot Growth Parameters

Figure 7:
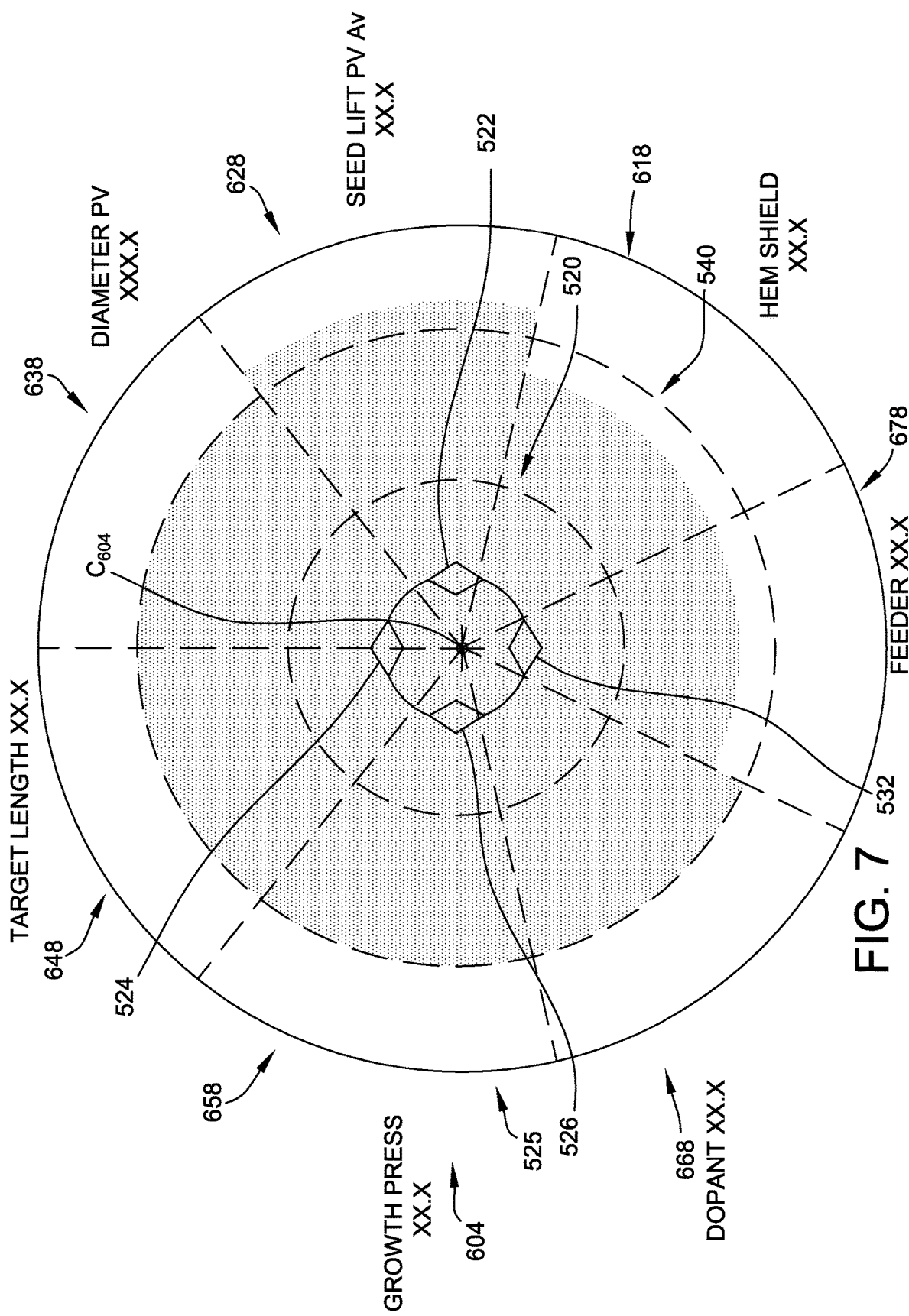
FIG. 7 is a dynamic state chart that includes seven sectors with each sector associated with an ingot growth parameter.

A dynamic state chart 604 showing seven ingot growth parameters is shown in FIG. 7. The dynamic state chart is a dynamic circle state chart that includes a first sector 618 that monitors heat shield position, a second sector 628 that monitors seed lift velocity, a third sector 638 that monitors the diameter of the ingot, a fourth sector 648 that monitors the target length of the ingot, a fifth sector 658 that monitors the ingot growth system pressure, a sixth sector 668 that monitors dopant feed rate to the melt, and a seventh sector 678 monitoring the rate at which silicon is added to the melt. The monitored parameters may be directly measured or may be the output of one or more algorithms. The growth parameters have been normalized such that the target growth visual (i.e., arc) of each sector is at the same distance from the circle map center $C_{604}$.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for growing a single crystal silicon ingot in a Czochralski process, the method comprising:
   preparing a melt of silicon in a crucible;
   withdrawing a single crystal silicon ingot from the melt;
   providing a plurality of growth parameters related to growth of the single crystal silicon ingot; and
   providing a dynamic state chart that includes a visual representation of the growth parameters, the dynamic state chart being a circle state chart that is divided into sectors, each sector being associated with a growth parameter.

2. The method as set forth in claim 1 further comprising adding polycrystalline silicon to the melt while withdrawing the silicon ingot from the melt to replenish silicon in the crucible.

3. The method as set forth in claim 1 wherein the circle state chart has a center and each sector has an outer edge and a radius that extends from the circle state chart center to the outer edge, the radius changing in response to changes in a value of the growth parameter.

4. The method as set forth in claim 1 wherein the dynamic state chart includes a minimum and maximum growth parameter visual associated with each growth parameter.

5. The method a set forth in claim 1 wherein the growth parameters are selected from the group consisting of the ingot target length, the ingot diameter, the seed lift velocity, heat shield position, polysilicon feed rate, dopant feed rate, ingot puller pressure and ingot growth rate.

6. The method as set forth in claim 1 further comprising changing a color of the visual representation based on changes in one or more growth parameter values.

7. The method as set forth in claim 1 wherein the plurality of growth parameters are provided by:
   measuring the growth parameter in an ingot growth system, the crucible being disposed in a growth chamber of the ingot growth system; or
   generating the growth parameter from an algorithm.

8. A method for growing a single crystal silicon ingot in a Czochralski process, the method comprising:
   preparing a melt of silicon in a crucible;
   withdrawing a single crystal silicon ingot from the melt;
   providing a plurality of growth parameters related to growth of the single crystal silicon ingot; and
   providing a dynamic state chart that includes a visual representation of the growth parameters, the dynamic state chart including a minimum and maximum growth parameter visual associated with each growth parameter, the dynamic state chart being a circle state chart, the minimum growth parameter visual being a first arc and the maximum growth parameter visual being a second arc radially disposed outward from the first arc, the first arc and second arc defining an annular sector which represents an acceptable range of the growth parameter.

9. The method as set forth in claim 8 wherein the dynamic state chart includes a target growth parameter visual, the target growth parameter visual being a third arc, the third arc being disposed between the first arc and the second arc.

10. The method as set forth in claim 8 wherein:
    the first arcs of each sector are the same distance from a circle state chart center such that the first arcs combine to form a first circle; and
    the second arcs of each sector are the same distance from the circle state chart center such that the second arcs combine to form a second circle that is concentric to the first circle.

11. The method a set forth in claim 8 wherein the growth parameters are selected from the group consisting of the ingot target length, the ingot diameter, the seed lift velocity, heat shield position, polysilicon feed rate, dopant feed rate, ingot puller pressure and ingot growth rate.

12. An ingot growth system for producing a single crystal silicon ingot, the system comprising
    a growth chamber;
    a crucible disposed within the growth chamber configured to hold a melt including molten silicon;
    an ingot pulling mechanism for withdrawing an ingot from the melt;
    a control unit comprising a processor and a memory, the memory storing instruction that, when executed by the processor, cause the processor to:
    determine a plurality of growth parameters related to growth of the single crystal silicon ingot; and
    provide a dynamic state chart that includes a visual representation of the growth parameters to a user, the dynamic state chart including a minimum and maximum growth parameter visual associated with each growth parameter, the dynamic state chart being a circle state chart, the minimum growth parameter visual being a first arc and the maximum growth parameter visual being a second arc radially disposed outward from the first arc, the first arc and second arc defining an annular sector which represents an acceptable range of the growth parameter.

13. The ingot growth system as set forth in claim 12 further comprising a polycrystalline silicon feed system for adding polycrystalline silicon to the melt while withdrawing a silicon ingot from the melt to replenish silicon in the crucible.

14. The ingot growth system as set forth in claim 12 wherein the dynamic state chart includes a target growth parameter visual, the target growth parameter visual being a third arc, the third arc being disposed between the first arc and the second arc.

15. The ingot growth system a set forth in claim 12 wherein the growth parameters are selected from the group consisting of the ingot target length, the ingot diameter, the seed lift velocity, heat shield position, polysilicon feed rate, dopant feed rate, ingot puller pressure and ingot growth rate.

16. The ingot growth system as set forth in claim 12 wherein the memory stores instruction that, when executed by the processor, cause the processor to change a color of the visual representation based on changes in growth parameter value.

17. The ingot growth system as set forth in claim 12 wherein the system comprises a sensor system that measurers one or more ingot growth parameters, the sensor system being communicatively connected to the control unit.

18. An ingot growth system for producing a single crystal silicon ingot, the system comprising
    a growth chamber;
    a crucible disposed within the growth chamber configured to hold a melt including molten silicon;
    an ingot pulling mechanism for withdrawing an ingot from the melt;
    a polycrystalline silicon feed system for adding polycrystalline silicon to the melt while withdrawing a silicon ingot from the melt to replenish silicon in the crucible;
    a control unit comprising a processor and a memory, the memory storing instruction that, when executed by the processor, cause the processor to:
    determine a plurality of growth parameters related to growth of the single crystal silicon ingot; and
    provide a dynamic state chart that includes a visual representation of the growth parameters to a user, the dynamic state chart being a circle state chart that is divided into sectors, each sector being associated with a growth parameter.

19. The ingot growth system as set forth in claim 18 wherein the circle state chart has a center and each sector has an outer edge and a radius that extends from the circle state chart center to the outer edge, the radius changing in response to changes in a value of the growth parameter.

20. The ingot growth system as set forth in claim 18 wherein the system comprises a sensor system that measurers one or more ingot growth parameters, the sensor system being communicatively connected to the control unit.

* * * * *